United States Patent [19]

Verhaar

[11] Patent Number: 5,015,598

[45] Date of Patent: May 14, 1991

[54] METHOD OF MANUFACTURING A DEVICE COMPRISING MIS TRANSISTORS HAVING A GATE ELECTRODE IN THE FORM OF AN INVERTED "T"

[75] Inventor: Robertus D. J. Verhaar, Eindhoven, Netherlands

[73] Assignee: U.S. Philips Corporation, New York, N.Y.

[21] Appl. No.: 588,116

[22] Filed: Sep. 25, 1990

[30] Foreign Application Priority Data

Nov. 3, 1989 [FR] France .................. 89 14435

[51] Int. Cl.⁵ .......................................... H01L 21/265
[52] U.S. Cl. .................................... 437/44; 437/41; 437/191; 437/233; 156/643; 357/23.3
[58] Field of Search ........... 437/40, 41, 44, 46, 437/189, 190, 191, 233, 238; 357/23.3; 156/643; 148/DIG. 122

[56] References Cited

U.S. PATENT DOCUMENTS

| 4,642,878 | 2/1987 | Maeda | 437/34 |
| 4,818,715 | 4/1989 | Chao | 437/44 |
| 4,837,180 | 6/1989 | Chao | 437/44 |
| 4,906,589 | 3/1990 | Chao | 437/44 |
| 4,907,048 | 3/1990 | Huang | 357/23.3 |
| 4,925,807 | 5/1990 | Yoshikawa | 437/41 |
| 4,951,100 | 8/1990 | Parrillo | 357/23.3 |
| 4,963,504 | 10/1990 | Huang | 437/41 |
| 4,971,922 | 11/1990 | Watabe et al. | 437/233 |

FOREIGN PATENT DOCUMENTS

| 3813665 | 11/1988 | Fed. Rep. of Germany . |
| 0161282 | 12/1979 | Japan . |
| 0064973 | 4/1982 | Japan . |
| 0200576 | 11/1983 | Japan . |
| 0055665 | 3/1985 | Japan . |
| 0133366 | 5/1989 | Japan . |

OTHER PUBLICATIONS

Izawa et al., "The Impact of Gate-Drain Overlapped LDD (GOLD) for Deep Submicron VLSI's ", IEDM 1987, pp. 38–41.

Huang et al., "A Novel Submicron LDD Transistor with Inverse T-Gate Structure", IEDM 1986, pp. 742–745.

Huang et al., "Eliminating Spacer Induced Degradations in LDD Transistors", 3rd Int'l. Symp. on VLSI Technology Systems and Applications, May 1987.

Primary Examiner—O. Chaudhuri
Assistant Examiner—M. Wilczewski
Attorney, Agent, or Firm—Paul R. Miller

[57] ABSTRACT

A method is set forth comprising the deposition of a first and a second polycrystalline conducting layer, which are separated by an insulating layer, with the object of creating gate islands which extend in the direction of highly doped parts (22b, 23b) of source and drain zones. According to the invention, the gate islands (15) the first delimited in the first polycrystalline layer (12), after which the edges of these islands are protected with provisional spacers (20a) of an oxidation-preventing material, so that after ion implantation of the weakly doped portions (22, 23) of the source and drain, non-protected parts of the device can be re-oxidized. After this, the provisional spacers (20a) are removed and the second polycrystalline layer (30) is deposited, thus achieving electrical contact with the previously protected edges of the islands (15) of the first polycrystalline layer (12). Widened gate islands are finally formed by the insulating spacer technique (32).

10 Claims, 3 Drawing Sheets

METHOD OF MANUFACTURING A DEVICE COMPRISING MIS TRANSISTORS HAVING A GATE ELECTRODE IN THE FORM OF AN INVERTED "T"

FIELD OF THE INVENTION

The invention relates to a method of manufacturing a semiconductor device comprising at least one transistor of the MIS type having a source region and a drain region each comprising a weakly doped part and a highly doped part slightly offset laterally with respect to the weakly doped part, and a gate electrode in the form of an inverted "T", which covers the weakly doped part and extends laterally towards the highly doped part, which method comprises the following steps, starting from a semiconductor body covered by an insulating gate layer:
- a deposition of a first polycrystalline layer rendered conducting by doping,
- the formation of a first insulating layer for its later use as an etch stopper,
- the deposition of a second polycrystalline conducting layer,
- a combination of operations consisting first in limiting gate islands serving inter alia as a mask for the implantation of the weakly doped parts of the source and drain regions, and then in forming widened gate islands by means of one of the two polycrystalline conductive layers limited at the periphery of the preceding islands by insulating spacers formed in a second insulating layer, the part maintained of the second polycrystalline layer being in electrical continuity with the part maintained of the first polycrystalline layer, and
- the ion implantation of the highly doped parts of the source and drain regions, using these widened source islands as an implantation mask.

Background of the Invention

A MIS transistor having a projecting gate (or a gate in the form of an inverted "T") is known from the publication "Impact of the Gate-Drain Overlapped Device (GOLD) for deep submicrometer VLSI" by R. Izawa, D. Kure and E. Takeda, in the magazine I.E.E.E. Transactions on Electron Devices, V. 35, No. 12, December 1988.

A method of manufacturing a transistor of this type intended to form integrated circuits having a very high integration density is also mentioned in the same publication.

The authors have shown that the limitation of the performances of the MIS transistors of submicron dimensions with respect to the drain breakdown voltage, to the emission of hot carriers and/or to the insufficient transconductance could be obviated by the use of a gate electrode covering the weakly doped parts of the source and drain regions and extending in the direction of the highly doped parts of the regions over a distance which must be optimized.

The indicated method of manufacturing MIS transistors of this type utilizes two polycrystalline layers, the second of these layers projecting laterally form the gate islands and thus forming islands whose characteristic shape is that of an inverted "T".

According to the known method, these two polycrystalline layers are mutually separated by an extremely thin oxide layer having a thickness of, for example, 0.5 to 1 nm, so that this layer can serve as a reference for the stopping of etching the second polycrystalline layer during the formation of the gate islands, but nevertheless provides for a sufficient electrical conduction between the first and the second polycrystalline layers within the widened gate island of the finished device.

A disadvantage inherent in the known method resides in the difficulty to obtain in a reproducible manner an oxide layer having such a small thickness, which requires a very narrow compromise between the effectiveness of its etch stopper function and a fairly high electrical conduction of this layer in order not to induce parasitic effects in the operation of the transistors and more particularly in the effectiveness of the transmission of the voltage to the lower part of the gates in a wide frequency spectrum.

The invention has for its object to provide a modification of the known method in order to avoid the aforementioned disadvantage. It is based on the idea that the electrical conduction between the first and the second polycrystalline layer within the widened gate island of the finished device could be obtained by means independent of the thickness of the layer designated as first insulating layer and that in this manner there is the freedom of choosing for this layer a larger thickness, which can therefore be more readily obtained in a reproducible manner and is also less critical when used as an etch stopper.

Summary of the Invention

In fact, according to the invention, a method of manufacturing a semiconductor device of the kind defined in the introductory paragraph is characterized in that, after the first insulating layer has been formed, there are successively effected:
- limitation of the gate islands by local successive etching treatments of the first insulating layer and of the first polycrystalline layer,
- formation of provisional narrow spacers for the protection against oxidation of the edges of the gate islands by deposition of a layer of oxidation-preventing material followed by an anisotropic etching of the major part of this layer,
- ion implantation of the weakly doped parts of the source and drain regions, using the gate islands provided with the provisional spacers as an implantation mask,
- re-oxidation of the parts of the device not protected by the provisional spacers,
- removal by selective etching of the provisional spacers,
- deposition of the second polycrystalline layer,
- formation of insulating spacers obtained by deposition of a second insulating layer followed by an anisotropic etching of the major part of said second insulating layer,
- formation of widened gate islands by selective etching of the major part of the second polycrystalline layer, using on the one hand the insulating spacers as a protection mask and on the other hand the first insulating layer as an etch stopper,
- ion implantation of the highly doped parts of the source and drain regions, using the widened gate islands as an implantation mask, and
- operations for finishing the device with respect to the contact connections and to the electrical connections with the active regions and the gates of the transistors.

According to the method of the invention, the electrical continuity within the widened gate islands is ensured by the lateral contact between the residual part of the first polycrystalline layer and the "L"-shaped residual parts of the second polyCrystalline layer.

It is therefore not necessary, as it is in the case of the known method, to make use of a first insulating layer, whose thickness is sufficiently small to ensure an electrical conduction between the two polycrystalline layers constituting the gate electrode of the transistor. In the method according to the invention, on the contrary, use is advantageously made of a first insulating layer, whose thickness exceeds 30 nm, which renders the method readily reproducible and simple to carry out when the first and second insulating layers are made of silicon oxide.

By the use of provisional spacers of an oxidation preventing material like silicon nitride, the method according to the invention permits carrying out the reoxidation of the source and drain regions and especially the parts which are adjacent to the channel of the transistors and which could have been damaged or could be subjected to a pollution during the ion etching of the first polycrystalline layer.

If desired, before carrying out the reoxidation step, the parts of the device not protected by the provisional spacers can even be freed from the existing insulating layers by selective etching and these layers can then be refreshed during the so-called reoxidation step. The provisional spacers are made sufficiently thin so that the reoxidation is also effected in the lateral direction over a short distance under the spacers.

Thus, according to a preferred embodiment of the invention, the provisional spacers are obtained from a silicon nitride layer having a thickness lying between 15 and 50 nm and preferably close to 30 nm.

In a variation, moreover, the method according to the invention is characterized in that additional parts of the source and drain regions having an intermediate doping are obtained by ion implantation after the deposition of the second polycrystalline layer and before the formation of the insulating spacers.

The method according to the invention permits providing the contact connections on the device by opening contact windows located by means of a photosensitive mask according to the conventional well known techniques.

However, it would also be desirable to be able to provide metallic contact areas on the device by a selfalignment technique using inter alia a metal silicide according to a technique which would not require a mask for the formation of the contact windows.

In this case, it is possible to obtain a substantial reduction of the dimensions of the transistors and to increase the integration density of the devices having a very large number of elements.

This possibility is obtained in a particular embodiment according to the invention, characterized in that after the formation of the insulating spacers the removal by selective etching of the second polycrystalline layer not protected by the insulating spacers is prolonged by a given duration in isotropic etching conditions so as to form grooves in the unprotected parts of the second polycrystalline layer, and in that these grooves are then filled with a particular insulating material having selective etching characteristics, such as silicon nitride, by the successive steps of depositing a layer of such material and of anisotropically etching the major part of this layer, which is situated outside the grooves.

Contact windows can then be opened selectively on the parts of the device having silicon oxide at the surface, while at the periphery of these regions strips of the particular insulating material subsist, which form a necessary lateral insulation between the contact pads formed on the active regions.

In order that the invention may be readily carried out, it will now be described more fully, by way of example, with reference to the accompanying drawings.

DESCRIPTION OF EMBODIMENTS

For the sake of clarity of the Figures, the proportions of the dimensions are not taken into account and more particularly some dimensions in the direction of thickness are considerably exaggerated. In general, the corresponding elements in the different Figures are provided with the same reference symbols.

Figure 1:
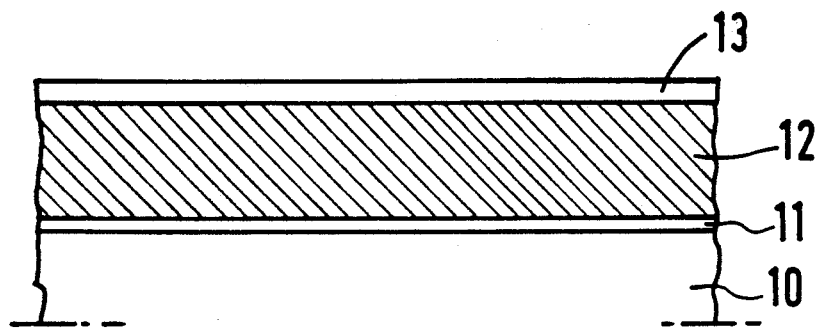
FIGS. 1, 2, 3, 4, 5, 6, 7 and 8 show diagrammatically in sectional view a part of a device of the MIS type illustrating different steps of the method according to the invention in a first embodiment.

FIG. 1 shows a superficial part of a semiconductor body 10, for example of p-type silicon, on which is disposed an insulating gate layer 11, preferably consisting of silicon oxide and having a thickness of approximately 20 nm. A first polycrystalline layer 12 having a thickness of about 300 nm has then been deposited on the insulating gate layer 11. The first polycrystalline layer 12 has been rendered conducting by doping at a high concentration according to one of the conventional techniques, particularly by doping during deposition.

Subsequently, a first insulating layer 13 of silicon oxide intended to serve later as an etch stopper is formed at the surface of the first polycrystalline layer 12.

Figure 2:
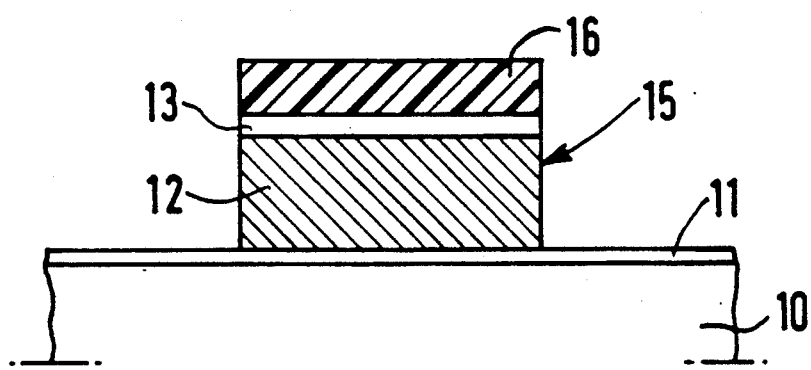
Figure 3:
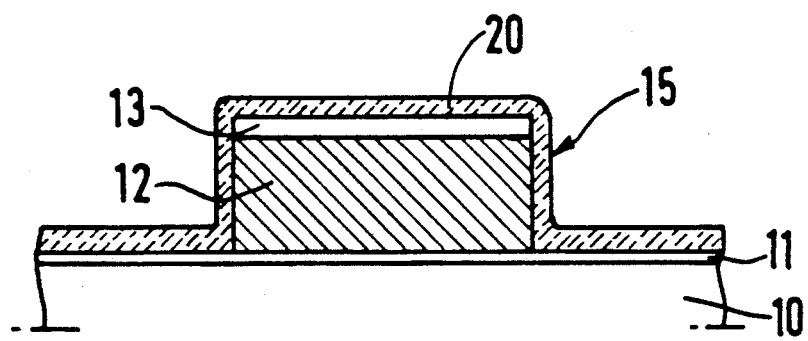

As indicated in FIG. 2, a local etching of the first insulating layer 13 and of the first polycrystalline layer 12 is then carried out so as to form gate islands 15 according to known anisotropic etching techniques by means of a mask of photosensitive lacquer 16.

In brief, the gate islands can be obtained by carrying out first a selective local etching of the first insulating layer 13 in a plasma containing a mixture of fluorine and oxygen ions, then removing the photosensitive lacquer mask 16 by means of an oxygen plasma, and finally selectively etching away the first polycrystalline layer 12 in the previously opened windows in the first insulating layer 13 by means of a plasma containing mainly chlorine ions. As is known, the etching of the polycrystalline material is selective with respect to silicon oxide so that the oxide gate layer 11, although it is comparatively thin, constitutes an etch stopper at the end of the operation.

After this, a protective layer of an oxidation-preventing material 20, such as silicon nitride, having a thickness lying between 15 and 50 nm and preferably close to 30 nm is deposited by a method ensuring a coverage as uniform as possible of the contours of the surface of the device, inclusive of the substantially vertical parts of the edges of the gate islands 15. For example, use is made of the known method of low-pressure chemical vapour deposition (LPCVD).

Figure 4:
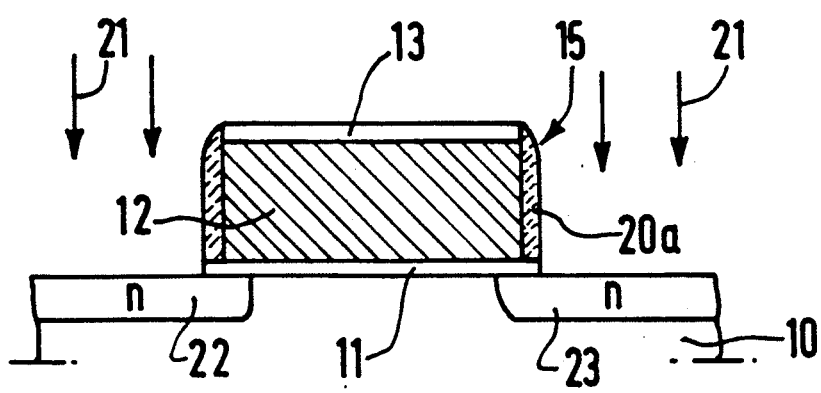

Subsequently, the major part of the protective silicon nitride layer 20 is etched by an anisotropic etching method, for example reactive fluorine or chlorine ion etching, so as to form provisional narrow spacers 20a for the protection of the edges of the gate islands 15, as is indicated in FIG. 4.

Depending on the type of etching ions used, the etching of the silicon nitride is not always selective with respect to the etching of silicon oxide. In given cases, the unprotected parts of the insulating gate layer 11, which are situated outside the gate islands 15, are eliminated due to the fact that this insulating layer is thin. In all cases, however, at least a substantial part of the first insulating layer 13 can be maintained at the upper surface of the gate island 15 because of its relatively great thickness. Subsequently, the ion implantation of a doping element of the n-type is carried out, indicated symbolically by the arrows 21, so as to form weakly doped parts of the source and drain regions 22, 23 while using the gate islands 15 provided with the provisional spacers 20a as an implantation mask.

By way of example, this operation may be carried out by implantation of phosphorus in a dose of $4 \times 10^{13}$ at/cm$^2$ at an energy of 50 to 60 keV.

Figure 5:
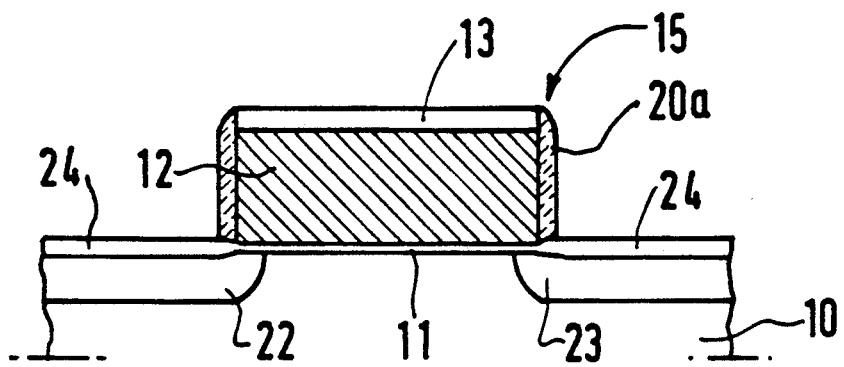

As a result of the operation of etching the first polycrystalline layer 12 and the ion implantation 21, the ends of the insulating gate layer 11 at the edges of the gate islands 15 and especially under the provisional spacers 20a have become degraded and/or polluted. In order to ensure a satisfactory operation of the device of the MIS type, it is therefore necessary to regenerate the parts of the insulating gate layer 11 in the proximity of these ends situated under the provisional spacers 20a, which is attained, as indicated in FIG. 5, by a step of reoxidation of the parts of the device which are not protected by the provisional spacers 20a. This operation is effected, for example, by a thermal oxidation at 900° C. for a duration of 15 to 30 minutes in oxygen. The first insulating layer 13 is then reformed and/or regenerated, depending upon whether is was completely eliminated beforehand or was maintained over part of its thickness. Above the exposed parts of the source and drain regions 22, 23, a silicon oxide layer 24 is formed having a thickness of the order of 10 to 15 nm, while the parts of the insulating gate layer 11 which are situated under the provisional spacers 20a and whose integrity has a determinative influence on the operation of the device are regenerated by a lateral oxidation effect under the provisional spacers 20a.

Figure 6:
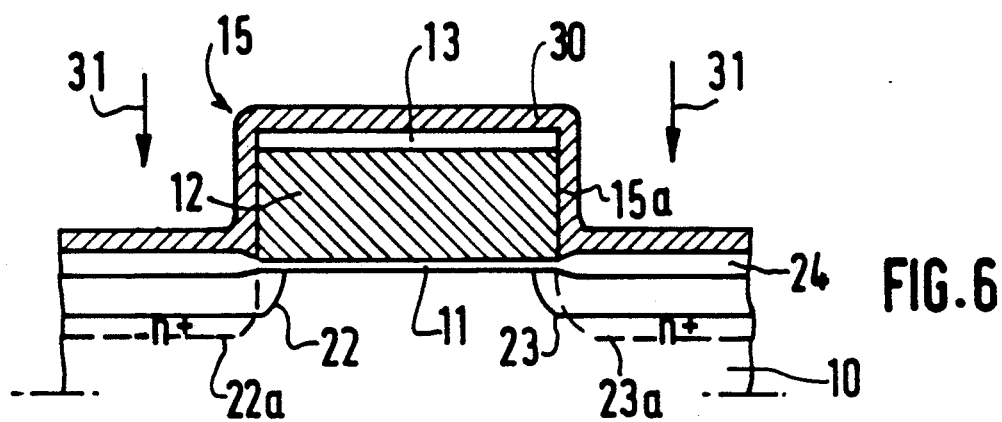

The following steps are shown diagrammatically in FIG. 6. First the provisional spacers 20a are removed by selective, for example wet, etching in hot phosphoric acid (140° C.). A second polycrystalline layer 30 having a thickness of about 50 nm is then deposited, which is rendered conducting by doping. This operation is carried out preferably by a method ensuring a good coverage of the edges of the gate islands 15 and, for example, by low-pressure chemical vapour deposition.

It should be noted that, if the second polycrystalline layer 30 is insulated above the gate islands 15 by the first insulating layer 13, it is nevertheless in electrical contact with the first polycrystalline layer 12 at the edges 15a of the gate islands 15, which edges were protected during the step of reoxidation by the provisional spacers 20a of silicon nitride.

At this stage, according to a preferred variation of the method in accordance with the invention, an ion implantation can be carried out, which is indicated symbolically by the arrows 31, in order to obtain additional parts 22a and 23a of the source and drain regions having an intermediate (n+) doping to insure a more progressive variation of the doping in a lateral direction between the channel and the source and drain regions having a high doping. Such an ion implantation operation may be carried out, for example, with a dose of $2 \times 10^{14}$ at/cm$^2$ at an energy of 50 to 70 keV.

Figure 7:
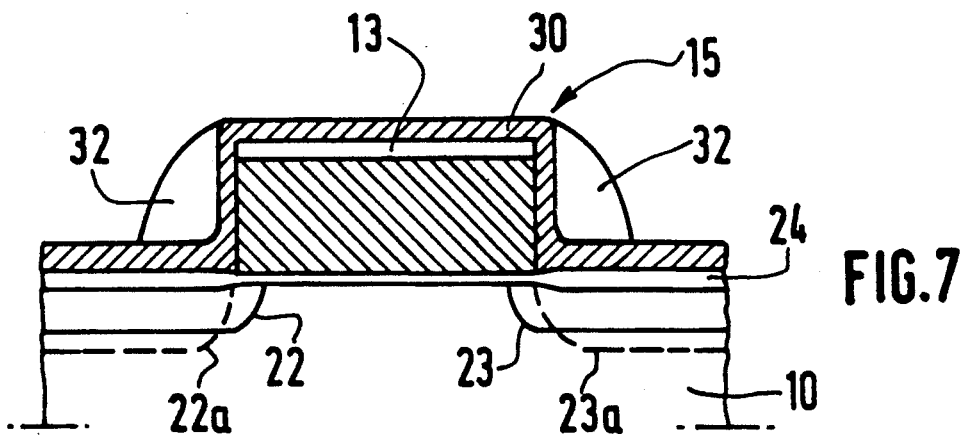

According to FIG. 7, insulating spacers 32 are then formed on the edges of the gate islands 15 according to a known technique, which essentially consists in that a second insulating layer of silicon oxide having a comparatively large thickness in the order of 200 nm is deposited and in that then the major part of this layer is removed by anisotropic etching, the second polycrystalline layer 30 forming an etch stopper for this operation.

The following operation (FIG. 8) consists in that the major part of the second polycrystalline layer 30 is removed, that is to say that the parts not protected by silicon oxide (first insulating layer 13 and insulating spacers 32) are removed, so that, from the gate islands 15, widened gate islands 35 are formed, whose dimensions are enlarged by the width of the insulating spacers 32. After that, highly doped parts (n++) 22b, 23b of the source and drain regions, respectively, are formed by ion implantation, as indicated by the arrows 36. This can be done with arsenic ions in a dose of $2 \times 10^{15}$ at/cm$^2$ at an energy of 100 keV.

Figure 8:
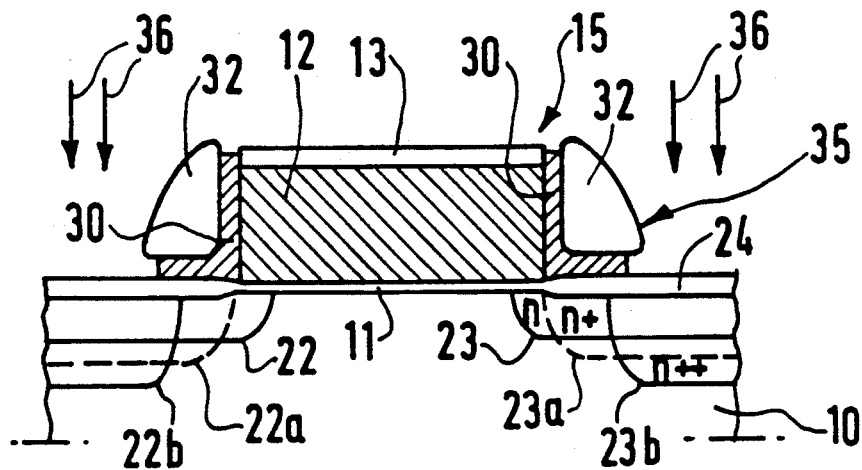

It should be noted that in FIG. 8 the parts subsisting of the second polycrystalline layer 30 in the form of an L, which are in electrical contact with the part of the first polycrystalline layer 12 of the gate island 15, constitute together with the first polycrystalline layer a gate electrode in the form of an inverted "T", which covers the weakly doped parts 22, 23 of the source and drain regions as well as any possible parts having an intermediate doping 22a, 23a. This gate electrode extends laterally toward the highly doped parts 22b, 23b of the source and drain regions.

It should further be noted that the source and drain regions having different dopings 22, 23, 22a, 23a, 22b, 23b are shown in a laterally stepped manner in the order which is suitable to promote a high breakdown voltage of the drain substrate diode and to reduce the emission of charge carriers of high energy when passing this junction.

From this stage, the device can be finished by opening contact windows located by means of a photosensitive mask by means of conventional known techniques, which need not be described here in greater detail.

Figure 9:
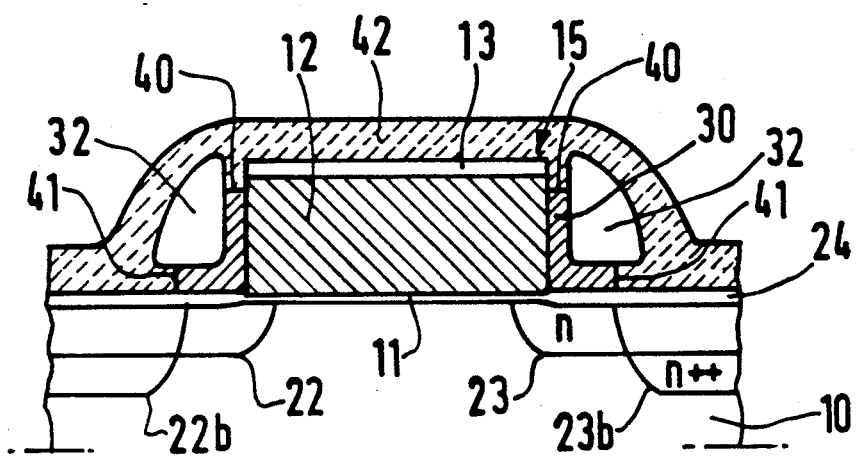
FIGS. 9 and 10 show diagrammatically in sectional view a variation of the embodiment according to the invention.
Figure 10:
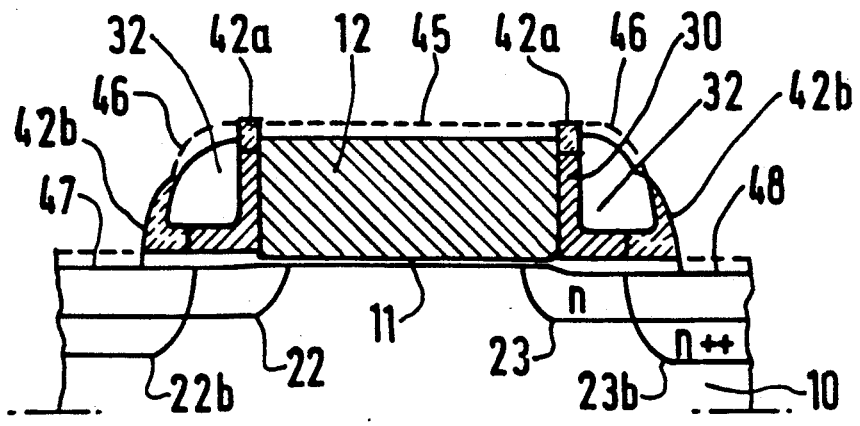

FIGS. 9 and 10 show another embodiment of the invention, which permits forming metallic contact areas on the device by a self-alignment technique.

According to this embodiment, the steps of the method as described with reference to FIGS. 1 to 8 are identical.

After the formation of the insulating spacers 32, the removal by selective etching of the second polycrystalline layer 30, which is not protected by the insulating spacers 32, is prolonged by a given duration in isotropic etching conditions so as to form grooves 40 on either side of the gate islands 15 and grooves 41 under the insulating spacers 32 between the latter and the insulating layer 24. These grooves are formed in the second polycrystalline layer 30 by lateral etching in the unprotected parts of this layer. Subsequently, a layer of insulating material having selective etching characteristics, for example a layer of silicon nitride 42 having a thickness of about 100 nm is deposited on the whole device by a method ensuring a good surface coverage, for example the low pressure chemical vapour deposition method, so that at least the grooves 40 and 41 are filled with silicon nitride.

The silicon nitride layer 42 is then etched anisotropically so that of this layer, only parts 42a and 42b are maintained (cf. FIG. 10) filling the grooves 40 and 41, respectively. The whole device is then subjected to an etching of the silicon oxide present at the surface selectively with respect to the silicon nitride and to the polycrystalline and monocrystalline silicon. The first insulating layer 13 is completely removed so that the first polycrystalline layer 12 of the gate island and the contact zones 47 and 48 of the source and drain regions are exposed. The contour of the first insulating layer 13 and insulating spacers 32 before this operation are indicated by the dotted lines 45 and 46, respectively. Taking into account their considerable thickness, the major part of the insulating spacers 32 remains after this operation.

As shown in FIG. 10, the metallic contact areas can now be formed in a self-aligned manner on the device, because the source and drain contact zones 47 and 48 and the upper part of the gate islands formed mainly by the first polycrystalline layer 12 are exposed and a layer of metal silicide can be provided therein in a self-aligned manner. The different parts of this silicide layer (not shown) are insulated from each other by parts 42a, 42b of the layer of silicon nitride 42 and by the insulating spacers 32.

Again a device comprising a transistor of the MIS type is obtained having a gate electrode in the form of an inverted "T", which covers the weakly doped parts 22 and 23 of the source and drain regions and extends by the subsisting parts of the second polycrystalline layer 30 in the form of an L towards the highly doped parts 22b, 23b of the source and drain regions. The lateral extent of this gate electrode is controlled during the etching step of the second polycrystalline layer 30. In FIGS. 9 and 10, no parts having an intermediate doping of the source and drain regions, such as described in FIG. 8 in the first embodiment of the invention, are indicated, but of course these additional parts having an intermediate doping may also be formed in the embodiment just described. The process described up to here applies to the manufacture of MIS transistors of very small dimensions. In order to increase the integration density it may be necessary to provide contacts on the source and drain silicide layers, which also project partly over the gate island 15, though without making contact with it.

In that case the contact with the gate island 15 is effected at another location, remote from the sectional plane of the Figures.

This provision (not shown in the drawings) can also be made with the process according to the invention in an embodiment thereof using self-aligned contacts covered with a metal silicide.

It is sufficient for this to make the second insulating layer 13 markedly thicker in certain locations which have to become protected by a metallic contact.

This is easily achieved when the second insulating layer 13 is applied in two steps: a first deposition step of a thick layer, for example 250 nm of silicon oxide, which is by means of localized etching, retained exclusively at locations to be protected, followed by a second deposition step for a 60 nm thick silicon oxide layer covering the whole device.

By limiting the etching time of the second insulating layer 13 to a suitable value, during the process stage described hereinbefore with reference to FIG. 10, it is easy to achieve that certain portions of gate island 15 remain protected by the oxide (where the first insulating layer was provided with greater thickness), while other, non-protected portions are exposed and thus become available for contacting by means of a metal silicide.

I claim:

1. A method of manufacturing a semiconductor device comprising at least one transistor of the MIS type having a source region and a drain region each comprising a weakly doped part and a highly doped part slightly offset laterally with respect to the weakly doped part, and a gate electrode in the form of an inverted "T", which covers the weakly doped part and extends laterally towards the highly doped part, which method comprises the following steps, starting from a semiconductor body covered by an insulating gate layer:

a deposition of a first polycrystalline layer rendered conducting by doping, the formation of a first insulating layer for its later use as an etch stopper, the deposition of a second polycrystalline conducting layer, a combination of operations consisting first in limiting gate islands serving inter alia as a mask for the implantation of the weakly doped parts of the source and drain regions, and then in forming widened gate islands by means of one of the two polycrystalline conductive layers limited at the periphery of the preceding islands by insulating spacers formed from a second insulating layer, the part maintained of the second polycrystalline layer being in electrical continuity with the part maintained of the first polycrystalline layer, and the ion implantation of the highly doped parts of the source and drain regions, using these widened source islands as an implantation mask, characterized in that, after the first insulating layer has been formed, there are successively effected:

limitation of the gate islands by successive etching treatments of the first insulating layer and of the first polycrystalline layer, formation of provisional narrow spacers for the protection against oxidation of the edges of the gate islands by deposition of a layer of oxidation-preventing material followed by an anisotropic etching of the major part of this layer, ion implantation of the weakly doped parts of the source and drain regions, using the gate islands provided with the provisional spacers as an implantation mask, re-oxidation of the parts of the device not protected by the provisional spacers, removal by selective etching of the provisional spacers, deposition of the second polycrystalline layer, formation of insulating spacers obtained by deposition of a second insulating layer followed by an anisotropic etching of the major pat of said second insulating layer, formation of widened gate islands by selective etching of the major part of the second polycrystalline layer, using on the one hand the insulating spacers as a protection mask and the first insulating layer as an etch stopper, ion implantation of the highly doped parts of the source and drain regions while using the widened gate islands as an implantation mask, and operations for finishing the device with respect to the contact connections and to the electrical connections with the active regions and the gates of the transistors.

2. A method as claimed in claim 1, characterized in that provisional spacers are obtained from a layer of silicon nitride having a thickness lying between 15 and 50 nm and preferably close to 30 nm.

3. A method as claimed in claim 1, characterized in that additional parts of the source and drain regions having an intermediate doping are obtained by ion implantation after the deposition of the second polycrystalline layer and before the formation of the insulating spacers.

4. A method as claimed in claim 1, characterized in that a first insulating layer is used, whose thickness exceeds 30 nm.

5. A method as claimed in claim 2, characterized in that provisional spacers are obtained from a layer of silicon nitride having a thickness lying between 15 and 50 nm and preferably close to 30 nm.

6. A method as claimed in claim 5, characterized in that additional parts of the source and drain regions having an intermediate doping are obtained by ion implantation after the deposition of the second polycrystalline layer and before the formation of the insulating spacers.

7. A method as claimed in claim 6, characterized in that after the formation of the insulating spacers, the removal by selective etching of the second polycrystalline layer not protected by the insulating spacers is prolonged by a given duration in isotropic etching conditions so as to form grooves in the unprotected parts of the second polycrystalline layer, and in that these grooves are then filled with a particular insulating material having selective etching characteristics, by the successive steps of depositing a layer of such material and of anisotropically etching the major part of this layer, which is situated outside the said grooves.

8. A method as claimed in claim 7, characterized in that the said particular insulating material is silicon nitride, and in that the deposited layer of this insulating material has a thickness of approximately 100 nm.

9. A method as claimed in claim 1, characterized in that after the formation of the insulating spacers, the removal by selective etching of the second polycrystalline layer not protected by the insulating spacers is prolonged by a given duration in isotropic etching conditions so as to form grooves in the unprotected parts of the second polycrystalline layer, and in that these grooves are then filled with a particular insulating material having selective etching characteristics, by the successive steps of depositing a layer of such material and of anisotropically etching the major part of this layer which is situated outside said grooves.

10. A method as claimed in claim 9, characterized in that said particular insulating material is silicon nitride, and in that the deposited layer of this insulating material has a thickness of approximately 100 nm.

* * * * *